(12) United States Patent
Kaes et al.

(10) Patent No.: US 8,404,970 B2
(45) Date of Patent: Mar. 26, 2013

(54) BIFACIAL SOLAR CELLS WITH BACK SURFACE DOPING

(75) Inventors: Martin Kaes, Berlin (DE); Peter Borden, San Mateo, CA (US); Kamel Ounadjela, Belmont, CA (US); Andreas Kraenzl, Radolfzell (DE); Alain Blosse, Belmont, CA (US); Fritz G. Kirscht, Berlin (DE)

(73) Assignee: Silicor Materials Inc., Palo Alto, CA (US)

( * ) Notice: Subject to any disclaimer, the term of this patent is extended or adjusted under 35 U.S.C. 154(b) by 309 days.

(21) Appl. No.: 12/456,404

(22) Filed: Jun. 15, 2009

(65) Prior Publication Data

US 2010/0275984 A1    Nov. 4, 2010

Related U.S. Application Data

(60) Provisional application No. 61/215,199, filed on May 1, 2009.

(51) Int. Cl.
*H01L 31/00* (2006.01)

(52) U.S. Cl. ........ 136/261; 136/252; 136/255; 136/256; 136/259

(58) Field of Classification Search .................. 136/244, 136/252, 255, 256, 261, 259
See application file for complete search history.

(56) References Cited

U.S. PATENT DOCUMENTS

| | | | |
|---|---|---|---|
| 4,468,853 A | 9/1984 | Morita et al. | |
| 4,994,879 A | 2/1991 | Hayashi | |
| 5,665,175 A | 9/1997 | Safir | |
| 6,096,968 A | 8/2000 | Schlosser et al. | |
| 7,495,167 B2 | 2/2009 | Joge et al. | |
| 8,298,850 B2 | 10/2012 | Kaes et al. | |
| 2004/0063326 A1 | 4/2004 | Szlufcik et al. | |
| 2005/0016585 A1* | 1/2005 | Munzer | 136/261 |
| 2005/0022863 A1* | 2/2005 | Agostinelli et al. | 136/256 |
| 2005/0056312 A1 | 3/2005 | Young et al. | |
| 2005/0133084 A1* | 6/2005 | Joge et al. | 136/255 |
| 2007/0137699 A1* | 6/2007 | Manivannan et al. | 136/261 |
| 2008/0257399 A1 | 10/2008 | Wong et al. | |
| 2010/0275983 A1* | 11/2010 | Kaes et al. | 136/255 |
| 2010/0275995 A1* | 11/2010 | Kaes et al. | 136/258 |

FOREIGN PATENT DOCUMENTS

| | | |
|---|---|---|
| CN | 102549765 A | 7/2012 |
| CN | 102656704 A | 9/2012 |
| CN | 102668114 A | 9/2012 |
| JP | 2007300128 A1 | 11/2007 |
| WO | WO/2008/039067 | 4/2008 |
| WO | WO-2010126572 A2 | 11/2010 |

(Continued)

OTHER PUBLICATIONS

International Application Serial No. PCT/US2010/001173 Search Report mailed Dec. 10, 2010, 3 pgs.

(Continued)

*Primary Examiner* — Jonathan Johnson
*Assistant Examiner* — Lindsey Bernier
(74) *Attorney, Agent, or Firm* — Schwegman Lundberg & Woessner, P.A.

(57) ABSTRACT

A simplified manufacturing process and the resultant bifacial solar cell (BSC) are provided, the simplified manufacturing process reducing manufacturing costs. The BSC includes an active region located on the front surface of the substrate, formed for example by a phosphorous diffusion step. The back surface includes a doped region, the doped region having the same conductivity as the substrate but with a higher doping level. Contact grids are formed, for example by screen printing. Front junction isolation is accomplished using a laser scribe.

8 Claims, 2 Drawing Sheets

FOREIGN PATENT DOCUMENTS

| WO | WO-2010126571 A3 | 1/2011 |
|---|---|---|
| WO | WO-2010126572 A3 | 1/2011 |
| WO | WO-2010126570 A3 | 2/2011 |

OTHER PUBLICATIONS

International Application Serial No. PCT/US2010/001173, Written Opinion mailed Dec. 10, 2010, 4 pgs.

International Application Serial No. PCT/US2010/001174, Search Report mailed Nov. 30, 2010, 3 pgs.

International Application Serial No. PCT/US2010/001174, Written Opinion mailed Nov. 30, 2010, 5 pgs.

International Application Serial No. PCT/US2010/001175, Written Opinion mailed Dec. 6, 2010, 6 pgs.

International Application Serial No. PCT/US2010/001175, Search Report mailed Dec. 6, 2010, 3 pgs.

Hubner, A., et al., "Novel cost-effective bifacial silicon solar cells with 19.4% front and 18.1% rear efficiency", Applied Physics Letters, 70(8), See pp. 1009-1010 and figure 3, (Feb. 24, 1997), 1008-1010.

Kranzl, A., et al., "Bifacial Solar Cells on Multi-Crystalline Silicon with Boron BSF and Open Rear Contact", Conference Record of the 2006 IEEE 4th World Conference on Photovoltaic Energy Conversion, See pp. 968-969 and figures 2,6, (May 30, 2006), 968-971.

Ponce-Alcantara, S., et al., "Surface passivation layers for multicrystalline silicon solar cells", 2005 Spanish Conference on Electron Devices, (2005), 295-298.

T. Warabisako et al, Bifacial Multicrystalline Silicon Solar Cells, Photovoltaic Specialists Conference, May 10-14, 1993, Conference Record of the Twenty Third IEEE, pp. 248-251.

J. Schmidt et al, Record Low Surface Recombination Velocities on Low-Resistivity Silicon Solar Cell Substrates, Photovoltaic Specialists Conference, May 13-17, 1996, Conference Record of the Twenty Third IEEE, pp. 413-416.

D.S. Kim et al, Silicon Solar Cells with Boron Back Surface Field Formed by Using Boric Acid, 22nd European Photovoltaic Solar Energy Conference, Sep. 3-7, 2007.

R.R. King et al, Back Surface Cell Structures for Reducing Recombination in CZ Silicon Solar Cells, IEEE Photovoltaic Specialists Conference, Dec. 5-9, 1994, Conference Record of the Twenty Fourth IEEE, pp. 1291-1294.

F. Huster et al, ECV Doping Profile Measurement of Aluminum Alloyed Back Surface Fields, 20th European Photovoltaic Solar Energy Conference, Jun. 6-10, 2005.

U.S. Appl. No. 12/456,398, Restriction Requirement mailed Nov. 10, 2011, 6 pgs.

International Application Serial No. PCT/US2010/001173, International Preliminary Report on Patentability mailed Nov. 10, 2011, 6 pgs.

International Application Serial No. PCT/US2010/001174, International Preliminary Report on Patentability mailed Nov. 10, 2011, 7pgs.

International Application Serial No. PCT/US2010/001175, International Preliminary Report on Patentability mailed Nov. 10, 2011, 8 pgs.

U.S. Appl. No. 12/456,378, Response filed Apr. 19, 2012 to Non Final Office Action mailed Jan. 19, 2012, 8 pgs.

U.S. Appl. No. 12/456,378, Non Final Office Action mailed Jan. 19, 2012, 13 pgs.

U.S. Appl. No. 12/456,398, Non Final Office Action mailed Mar. 1, 2012, 13 pgs.

U.S. Appl. No. 12/456,398, Advisory Action mailed Oct. 19, 2012, 5 pgs.

U.S. Appl. No. 12/456,398, Response filed Oct. 2, 2012 to Non Final Office Action mailed Mar. 1, 2012, 9 pgs.

\* cited by examiner

BIFACIAL SOLAR CELLS WITH BACK SURFACE DOPING

CROSS-REFERENCE TO RELATED APPLICATION

This application claims the benefit of the filing date of U.S. Provisional Patent Application Ser. No. 61/215,199, filed May 1, 2009, the disclosure of which is incorporated herein by reference for any and all purposes.

FIELD OF THE INVENTION

The present invention relates generally to solar cells and, in particular, to an improved structure and manufacturing process for a bifacial solar cell.

BACKGROUND OF THE INVENTION

Bifacial solar cells (BSC) may use any of a variety of different designs to achieve higher efficiencies than those typically obtained by a conventional, monofacial solar cell. One such design is shown in U.S. Pat. No. 5,665,175 which discloses a BSC configuration with first and second active regions formed on the front and back surfaces of the BSC, respectively, the two regions separated by a distance $\lambda$. The distance $\lambda$ allows a leakage current to flow between the first and second active regions, thus allowing a solar cell panel utilizing such bifacial cells to continue to operate even if one or more individual solar cells become shaded or defective.

U.S. Pat. No. 7,495,167 discloses an $n^+pp^+$ structure and a method of producing the same. In the disclosed structure, the $p^+$ layer, formed by boron diffusion, exhibits a lifetime close to that of the initial level of the substrate. In order to achieve this lifetime, the '167 patent teaches that after phosphorous gettering, the cell must be annealed at a temperature of 600° C. or less for one hour or more. In order to retain the lifetime recovered by the phosphorous and low-temperature born gettering steps, the cell then undergoes a final heat treatment step in which the cell is fired at a temperature of around 700° C. or less for one minute or less.

U.S. Patent Application Publication No. 2005/0056312 discloses an alternative technique for achieving two or more p-n junctions in a single solar cell, the disclosed technique using transparent substrates (e.g., glass or quartz substrates). In one disclosed embodiment, the BSC includes two thin-film polycrystalline or amorphous cells formed on opposing sides of a transparent substrate. Due to the design of the cell, the high temperature deposition of the absorber layers can be completed before the low temperature deposition of the window layers, thus avoiding degradation or destruction of the p-n junctions.

Although there are a variety of BSC designs and techniques for fabricating the same, these designs and techniques tend to be relatively complex, and thus expensive. Accordingly, what is needed is a solar cell design that achieves the benefits associated with bifacial solar cells while retaining the manufacturing simplicity of a monofacial solar cell. The present invention provides such a design.

SUMMARY OF THE INVENTION

The present invention provides a simplified manufacturing process and the resultant bifacial solar cell (BSC), the simplified manufacturing process reducing manufacturing costs. In at least one embodiment of the invention, a manufacturing method is provided that is comprised of the steps of depositing a boron doped layer onto the back surface of a p-type silicon substrate, depositing a back surface dielectric over the boron doped layer, diffusing phosphorous onto the front surface of the silicon substrate to form an $n^+$ layer and a front surface junction, removing the phosphor-silicate glass formed during the diffusion step (e.g., by etching with HF), depositing a front surface passivation and AR dielectric layer onto the $n^+$ layer, applying front and back surface contact grids, firing the front and back surface contact grids, and isolating the front surface junction, for example using a laser scriber. The front and back surface contact grid firing steps may be performed simultaneously. Alternately, the back surface contact grid applying and firing steps may be performed prior to, or after, the front surface contact grid applying and firing steps. The boron doped layer depositing step can be formed by depositing a boron doped silicon dioxide layer using CVD, depositing a boron doped polysilicon layer using CVD, depositing a boron doped amorphous silicon layer using PE-CVD, spray coating a boric acid solution onto the back surface of the substrate, spray/wipe coating a boron-doped spin-on glass onto the back surface of the substrate, or by other means. The phosphorous diffusing step may be performed at a temperature in the range of 825° C. to 890° C. for a duration of approximately 10 to 20 minutes.

In at least one embodiment of the invention, a bifacial solar cell (BSC) is provided that is comprised of a silicon substrate of a first conductivity type with a front surface active region of a second conductivity type and a back surface doped region of the first conductivity type, dielectric layers deposited on the front surface active region and on the back surface doped region, a front surface contact grid applied to the front surface passivation and AR dielectric layer which alloys through the front surface dielectric to the active region during firing, a back surface contact grid applied to the back surface dielectric layer which alloys through the back surface dielectric to the back surface doped region during firing, and a groove on the front surface of the silicon substrate, the groove isolating the front surface junction. The silicon substrate may be comprised of p-type silicon, the active region may be comprised of $n^+$ material resulting from a phosphorous diffusion step, and the doped region may be comprised of a boron dopant. The silicon substrate may be comprised of n-type silicon, the active region may be comprised of $p^+$ material resulting from a boron diffusion step, and the doped region may be comprised of a phosphorous dopant.

A further understanding of the nature and advantages of the present invention may be realized by reference to the remaining portions of the specification and the drawings.

DESCRIPTION OF THE SPECIFIC EMBODIMENTS

Figure 1:
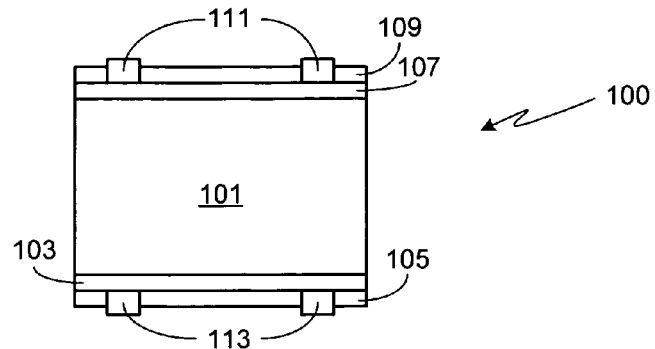
FIG. 1 illustrates a preferred embodiment of a BSC in accordance with the invention.
Figure 2:
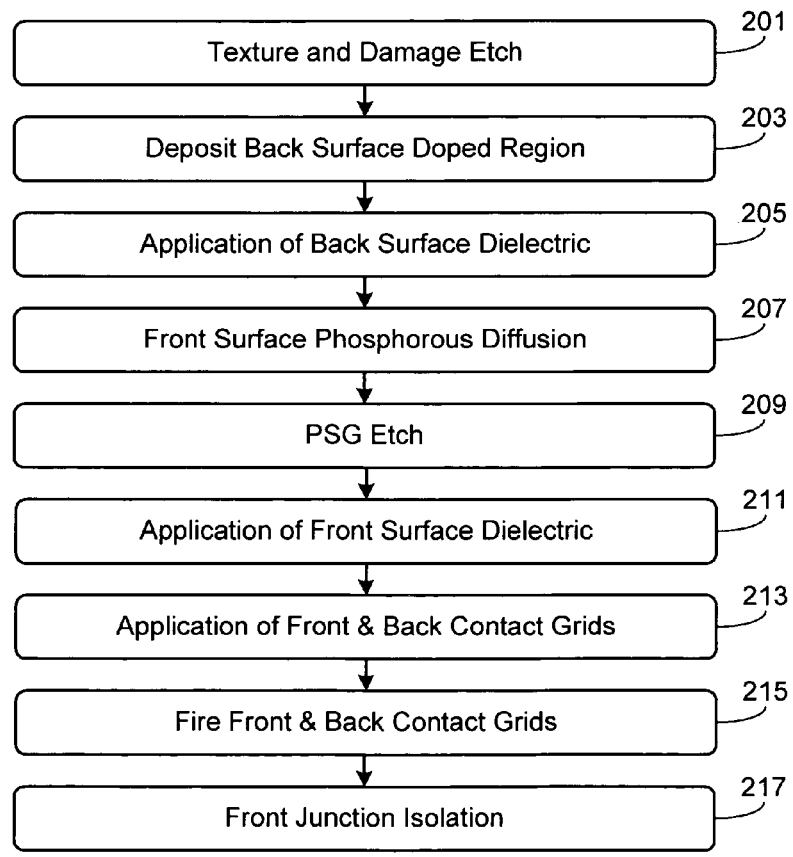
FIG. 2 illustrates the process flow for the BSC of FIG. 1.
Figure 3:
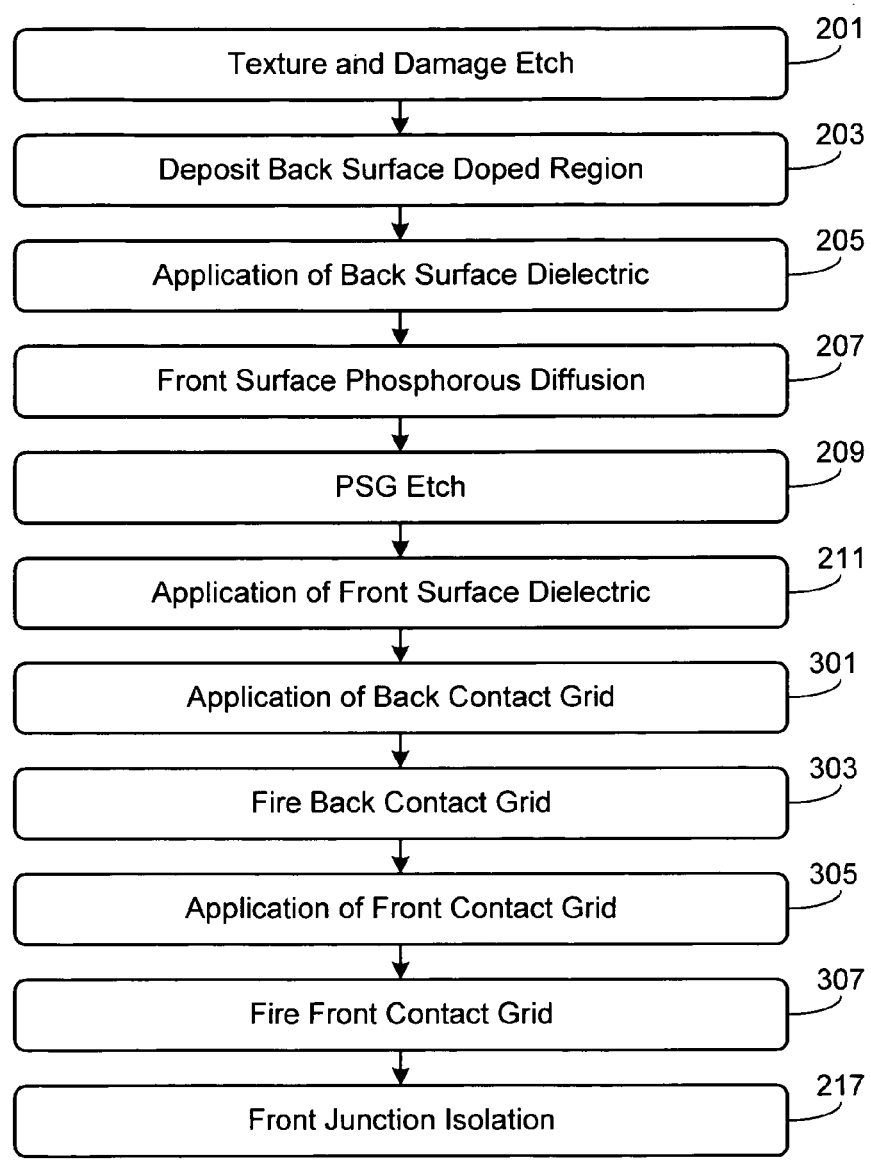
FIG. 3 illustrates an alternate process flow for the BSC of FIG. 1.

FIG. 1 illustrates a cross-sectional view of a preferred bifacial solar cell (BSC) structure fabricated in accordance with the procedure described in FIGS. 2 and 3. Silicon substrate 101 may be of either p- or n-type. In the exemplary device and process illustrated in FIGS. 1-3, a p-type substrate is used.

Initially, substrate 101 is prepared using any of a variety of well-known substrate preparatory processes (step 201). In general, during step 201 saw and handling induced damage is removed via an etching process, for example using a nitric and hydrofluoric (HF) acid mixture. After substrate preparation, the bottom surface of substrate 101 is doped, thereby forming a back surface doped region 103 (step 203). Region 103 is doped with the same doping type as substrate 101. Increasing the doping level of region 103, compared to substrate 101, lowers the contact resistance. Additionally, doped region 103 reduces back surface recombination and the effects of a positive potential in the back surface insulator to attract minority carriers to the back surface and thus away from the front surface collecting junction.

Region 103 can be formed using any of a variety of techniques. Exemplary techniques include, but are not limited to, chemical vapor deposition (CVD), plasma enhanced CVD (PE-CVD), spray coating, and spin coating. Accordingly, and assuming a p-type substrate, region 103 can be formed by depositing a boron doped polysilicon layer using CVD; depositing a boron doped silicon dioxide or amorphous silicon layer using PE-CVD; spray/spin coating a boric acid solution or doped spin-on glass onto the back surface of substrate 101; or by other means.

After formation of region 103, a dielectric layer 105 is deposited on the back surface of substrate 101, specifically on top of doped region 103 as shown (step 205). Preferably layer 105 is comprised of either silicon nitride or silicon dioxide, preferably deposited at a temperature of 300° C. to 400° C., and has a thickness of approximately 76 nanometers for silicon nitride or 100 nanometers for silicon dioxide. In an alternate embodiment, layer 105 is comprised of silicon oxynitride. In another alternate embodiment, layer 105 is comprised of a dielectric stack, for example 70 nanometers of silicon nitride on 10 nanometers of silicon dioxide or aluminum oxide.

After deposition of dielectric layer 105, phosphorous is diffused onto the front surface of substrate 101, creating n$^+$ layer 107 and a p-n junction at the interface of substrate 101 and n$^+$ layer 107 (step 207). Preferably n$^+$ layer 107 is formed using phosphoryl chloride (POCl$_3$), where the diffusion is performed at a diffusion temperature in the range of 825° C. to 890° C., preferably at a temperature of approximately 850° C., for 10 to 20 minutes in a nitrogen atmosphere (step 207). It will be appreciated that during the phosphorous diffusion step 207, boron from region 103 is diffused into the back surface of substrate 101 to form a back surface field (BSF). The phosphor-silicate glass (PSG) formed during diffusion step 207 is then etched away, for example using a hydrofluoric (HF) etch at or near room temperature for 1 to 5 minutes (step 209). In the preferred embodiment, the front side junction has a depth of 0.3 to 0.6 microns and a surface doping concentration of about $8 \times 10^{21}/cm^3$.

In step 211, a front surface passivation and anti-reflection (AR) dielectric layer 109 is deposited, layer 109 preferably being approximately 76 nanometers thick. In the exemplary embodiment, layer 109 is comprised of silicon nitride or silicon oxynitride. Preferably, layer 109 is deposited at a temperature of 300° C. to 400° C.

After deposition of the dielectric layer 109, contact grids are applied to the front and back surfaces of BSC 100 (step 213), for example using a screen printing process. In the exemplary embodiment, front contact grid 111 is comprised of silver while back contact grid 113 is comprised of an aluminum-silver mixture. In the preferred embodiment, both the front and back contact grids are aligned and use the same contact size and spacing, with electrodes being approximately 100 microns wide, 15 microns thick and spaced approximately 2.5 millimeters apart. In at least one alternate embodiment, the back contact grid uses a finer spacing in order to lessen resistance losses from lateral current flow in the substrate. Next, a contact firing step 213 is performed, preferably at a peak temperature of 750° C. for 3 seconds in air. As a result of this process, contacts 111 alloy through passivation and AR dielectric coating 109 to n$^+$ layer 107. Similarly, contacts 113 alloy through dielectric coating 105 to layer 103. Lastly, the front junction is isolated, for example using a laser scriber to form a groove on the front cell surface around the periphery of the cell (step 217).

FIG. 3 illustrates an alternate process for fabricating cell 100. As illustrated, this process is identical to that shown in FIG. 2, except that the front surface and back surface contact grids are applied and fired separately, thereby allowing different firing conditions to be used for each grid. Preferably contact grid 113 is applied (step 301) and fired (step 303) first, followed by the application (step 305) and firing (step 307) of front contact grid 111.

As previously noted, an n-type substrate may also be used with the invention. In such an embodiment, an n-type dopant, such as phosphorous, is used for region 103 while a p-type material, such as boron, is diffused into the front surface to form the p-n junction at the interface of substrate 101 and diffused region 107.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention.

What is claimed is:

1. A bifacial solar cell, comprising:
   a silicon substrate of a first conductivity type with a front surface and a back surface;
   a doped region of said first conductivity type located on said back surface of said silicon substrate;
   a dielectric stack including aluminum oxide and silicon nitride, deposited on said doped region;
   an active region of a second conductivity type located on said front surface of said silicon substrate;
   a passivation and AR dielectric layer deposited on said active region;
   a first contact grid applied to said dielectric layer, said first contact grid comprised of a first metal, wherein after a firing step said first contact grid is alloyed through said dielectric stack to said doped region located on said back surface of said silicon substrate;
   a second contact grid applied to said passivation and AR dielectric layer, said second contact grid comprised of a second metal, wherein after said firing step said second contact grid is alloyed through said passivation and AR dielectric layer to said active region; and
   a groove on said front surface of said silicon substrate, said groove isolating a front surface p-n junction formed by said active region and said silicon substrate.

2. The bifacial solar cell of claim 1, wherein said silicon substrate is comprised of a p-type silicon, said active region is comprised of n$^+$ material resulting from a phosphorous diffusion step, and said doped region is comprised of a boron dopant.

3. The bifacial solar cell of claim 2, wherein said dielectric stack includes a layer of silicon nitride over a layer of aluminum oxide, and wherein said passivation and AR dielectric layer silicon substrate is comprised of a material selected from the group consisting of silicon nitride and silicon oxynitride.

4. The bifacial solar cell of claim 1, wherein said silicon substrate is comprised of an n-type silicon, said active region is comprised of p$^+$ material resulting from a boron diffusion step, and said doped region is comprised of a phosphorous dopant.

5. A bifacial solar cell, comprising:
- a silicon substrate of a first conductivity type with a front surface and a back surface;
- a doped region of the first conductivity type located on the back surface of the silicon substrate;
- a dielectric stack including aluminum oxide and silicon nitride, located on the doped region;
- an active region of a second conductivity type located on the front surface of the silicon substrate;
- a passivation and AR dielectric layer located on the active region;
- a first contact grid alloyed through the dielectric stack to the doped region;
- a second contact grid alloyed through the passivation and AR dielectric layer to the active region.

6. The bifacial solar cell of claim 5, wherein said silicon substrate is comprised of a p-type silicon.

7. The bifacial solar cell of claim 5, wherein said silicon substrate is comprised of a n-type silicon.

8. The bifacial solar cell of claim 5, wherein said dielectric stack includes approximately 70 nanometers of silicon nitride approximately 10 nanometers of aluminum oxide.

* * * * *